(12) United States Patent
Wang

(10) Patent No.: US 8,331,184 B2
(45) Date of Patent: Dec. 11, 2012

(54) SRAM COMPATIBLE EMBEDDED DRAM SYSTEM WITH HIDDEN REFRESH AND DUAL PORT CAPABILITIES

(75) Inventor: Szu-Mien Wang, Taipei (TW)

(73) Assignee: Orise Technology Co., Ltd., Hsinchu Science Park (TW)

( * ) Notice: Subject to any disclaimer, the term of this patent is extended or adjusted under 35 U.S.C. 154(b) by 291 days.

(21) Appl. No.: 12/662,564

(22) Filed: Apr. 23, 2010

(65) Prior Publication Data

US 2010/0271895 A1      Oct. 28, 2010

(30) Foreign Application Priority Data

Apr. 23, 2009   (TW) ................................ 98113456 A

(51) Int. Cl.
*G11C 7/00*       (2006.01)

(52) U.S. Cl. ........................ 365/222; 365/154; 365/149

(58) Field of Classification Search .................. 365/222, 365/154, 149
See application file for complete search history.

(56) References Cited

U.S. PATENT DOCUMENTS

| 6,075,740 | A | 6/2000 | Leung |
| 6,449,685 | B1* | 9/2002 | Leung ........................... 711/106 |
| 7,359,275 | B1* | 4/2008 | Wu ........................ 365/230.05 |
| 2008/0005492 | A1 | 1/2008 | Leung |

* cited by examiner

*Primary Examiner* — Huan Hoang
(74) *Attorney, Agent, or Firm* — Bacon & Thomas, PLLC

(57) ABSTRACT

An SRAM compatible embedded DRAM system with hidden refresh and dual port capabilities includes a memory cell array comprised of a plurality of single-port memory cells with dual-port capability, a first and a second port access units connected to the memory cell array in order to access the memory cells, and an access arbiter connected to the first and the second port access units in order to arbitrate a first port access request, a second port access request and a hidden refresh request.

16 Claims, 11 Drawing Sheets

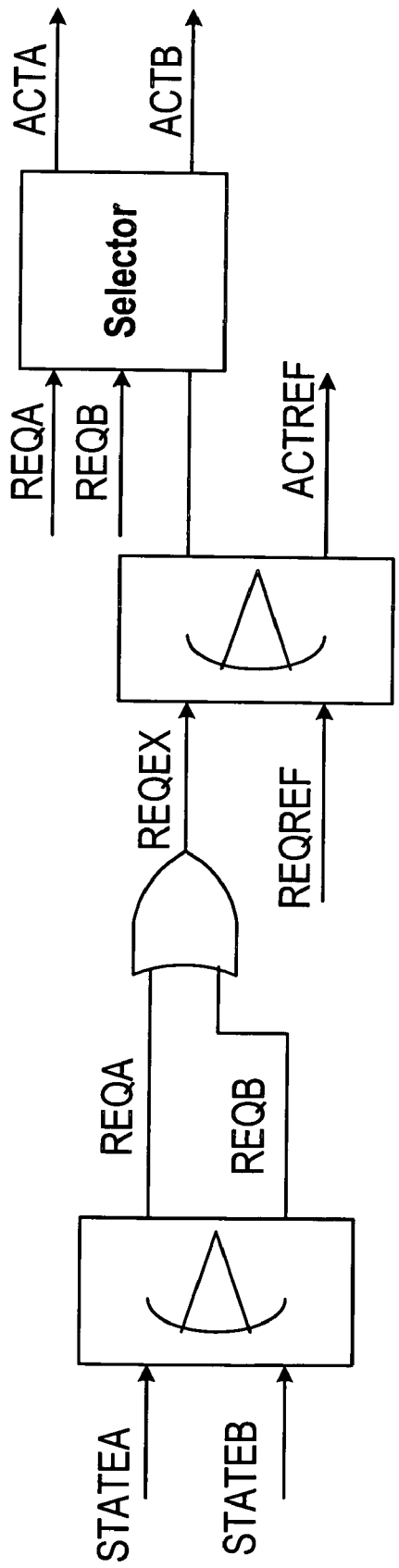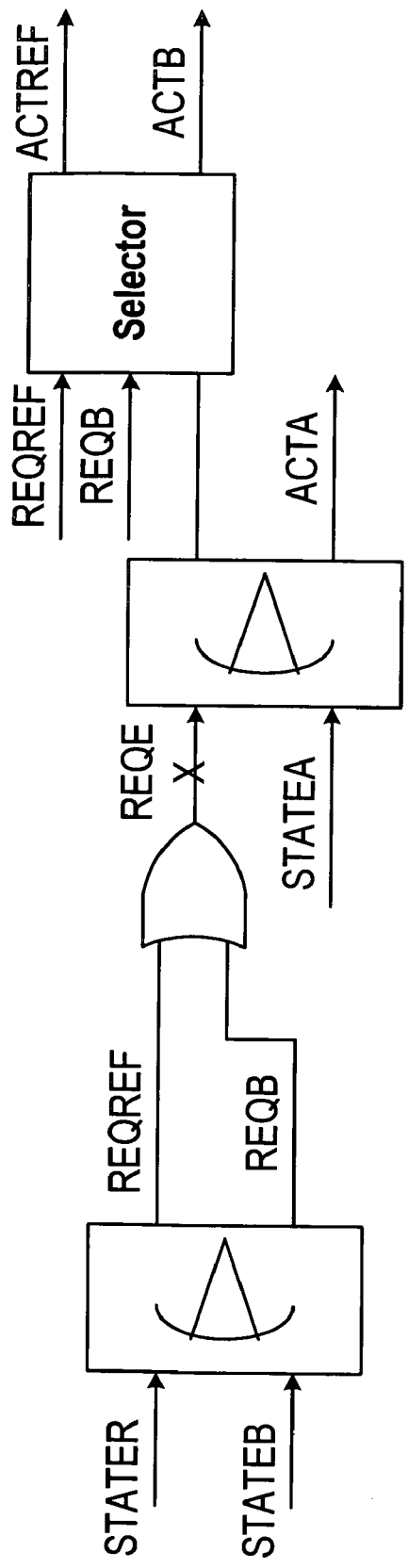
FIG. 10
FIG. 11

SRAM COMPATIBLE EMBEDDED DRAM SYSTEM WITH HIDDEN REFRESH AND DUAL PORT CAPABILITIES

BACKGROUND OF THE INVENTION

1. Field of the Invention

The present invention relates to the technical field of embedded memory and, more particularly, to an SRAM compatible embedded DRAM system with hidden refresh and dual port capabilities.

2. Description of Related Art

For a system on chip (SoC) application, it requires integration of multiple functional blocks into a single IC. A commonly used functional block typically includes a processor, a controller, a memory block and various functional logic blocks, which are all incorporated into one chip. The memory block can include an SRAM, a non-volatile memory and/or a register based memory (RBM). Typically, the RBM is used in a situation requiring small unit of high speed storage, such as a register file and/or a small-sized table used by one or more functional logic blocks in the SoC.

Generally, a SoC requires larger volatile or non-volatile memory blocks. However, for a cost consideration, a designer reduces the allocated areas for the memory blocks as small as possible. If a memory block is a refreshed volatile memory, the memory block is typically implemented with a 6-T SRAM cell.

For saving the cost, a method uses multiple dynamic random access memory (DRAM) cells and a static random access memory (SRAM) interface to form a 1T SRAM system. Such a method requires an automatic refresh mechanism to automatically refresh the DRAM cells in the 1T SRAM system to thereby avoid the lost data.

The 1T SRAM system, which is a single port memory system, is used in U.S. Pat. No. 6,075,740 granted to Leung for a "Method and apparatus for increasing the time available for refresh for 1-t SRAM compatible devices" to thereby save the cost, but it can easily cause an access bottleneck.

The access bottleneck is caused when many master devices in the SoC access an embedded memory. Accordingly, as shown in FIG. 1, US Patent Application Publication No. 2008/0005492 published Jan. 3, 2008, entitled "Dual-port SRAM memory using single-port memory cell" adds an arbiter 505, a multiplexer 502, a refresh controller 530 and interface circuits 510, 520 to allow the single-port memory array 501 to act as a dual-port SRAM memory.

Namely, in US 2008/0005492, the dual-port SRAM memory is implemented using the single-port memory array 501. However, with increasing the access clock on the SoC, such a memory system presents an access bottleneck in the SoC, so that the SoC clock cannot be effectively increased.

Therefore, it is desirable to provide an improved system to mitigate and/or obviate the aforementioned problems.

SUMMARY OF THE INVENTION

The object of the present invention is to provide an SRAM compatible embedded DRAM system with hidden refresh and dual port capabilities, which can overcome the prior problems of DRAM access bottleneck and ineffectiveness in increasing the SoC clock.

In accordance with a feature of the invention, a static random access memory (SRAM) compatible embedded dynamic random access memory (DRAM) system with hidden refresh and dual port capabilities is provided, which includes a memory cell array, a first port access unit, a second port access unit and an access arbiter. The memory cell array has a plurality of single-port memory cells with dual-port capability. The first port access unit is connected to the memory cell array in order to access the memory cells. The second port access unit is connected to the memory cell array in order to access the memory cells. The arbiter is connected to the first and the second port access units in order to arbitrate a first port access request, a second port access request and a hidden refresh request.

In accordance with another feature of the invention, a liquid crystal display (LCD) system using an SRAM compatible embedded DRAM device with hidden refresh and dual port capabilities is provided, which includes a processor interface, the SRAM compatible embedded DRAM device with hidden refresh and dual port capabilities, and an LCD interface. The processor interface receives a read/write signal from a processor. The SRAM compatible embedded DRAM device is connected to the processor interface and includes a memory cell array, a first port access unit, a second port access unit and an access arbiter. The memory cell array has a plurality of single-port memory cells with dual-port capability. The first port access unit is connected to the memory cell array in order to access the memory cells. The second port access unit is connected to the memory cell array in order to access the memory cells. The arbiter is connected to the first and the second port access units in order to arbitrate a first port access request, a second port access request and a hidden refresh request. The LCD interface is connected to the embedded DRAM device in order to present data of the embedded DRAM device.

Other objects, advantages, and novel features of the invention will become more apparent from the following detailed description when taken in conjunction with the accompanying drawings.

BRIEF DESCRIPTION OF THE DRAWINGS

FIG. 10 is a schematic diagram of a two-stage arbitration applied in FIG. 8 in accordance with an embodiment of the invention;

FIG. 11 is a schematic diagram of another two-stage arbitration applied in FIG. 8 in accordance with an embodiment of the invention.

DETAILED DESCRIPTION OF THE PREFERRED EMBODIMENT

Figure 1:
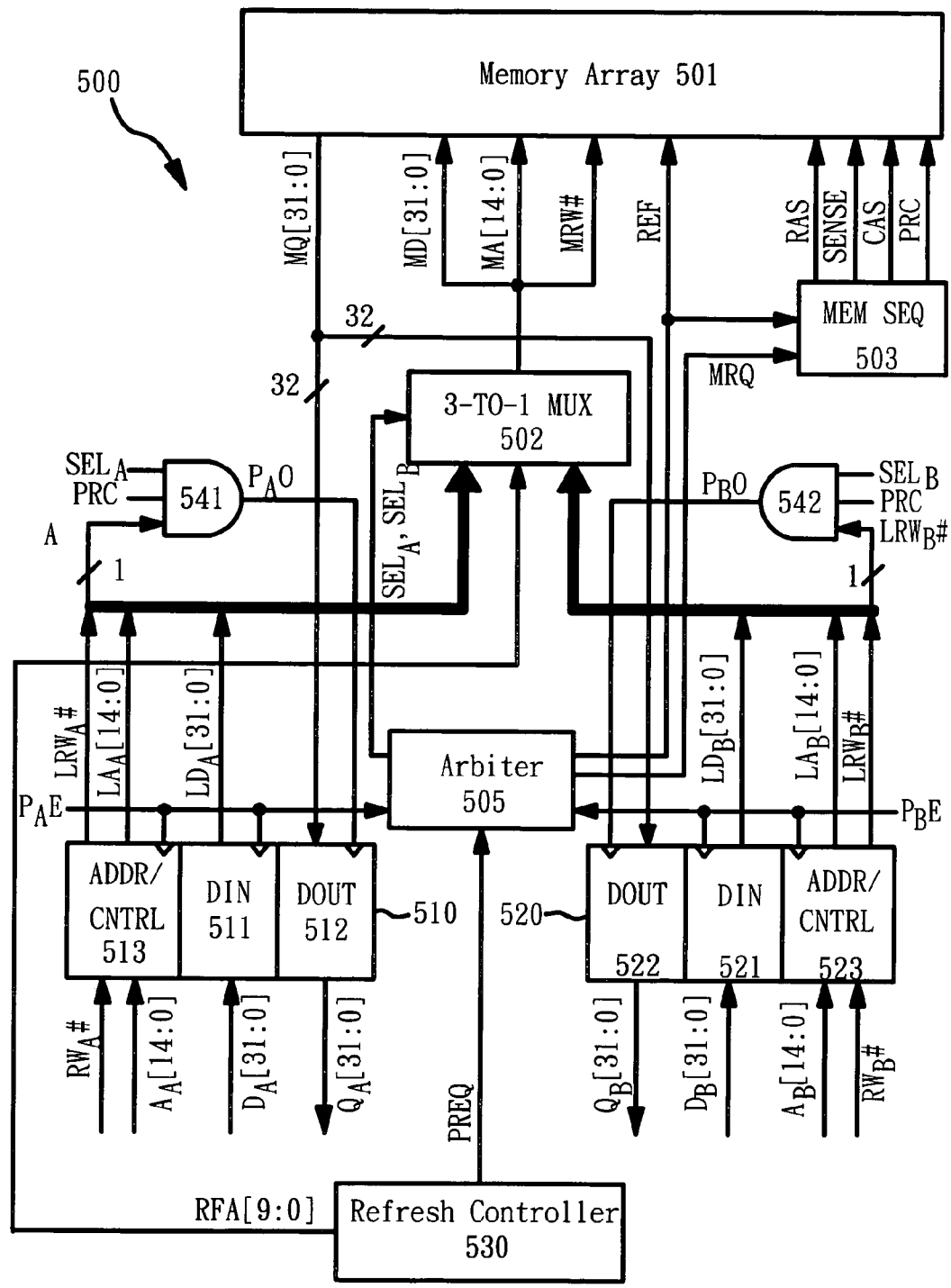
FIG. 1 is a schematic diagram of a dual port SRAM memory using a single port memory cell array used in the prior art.
Figure 2:
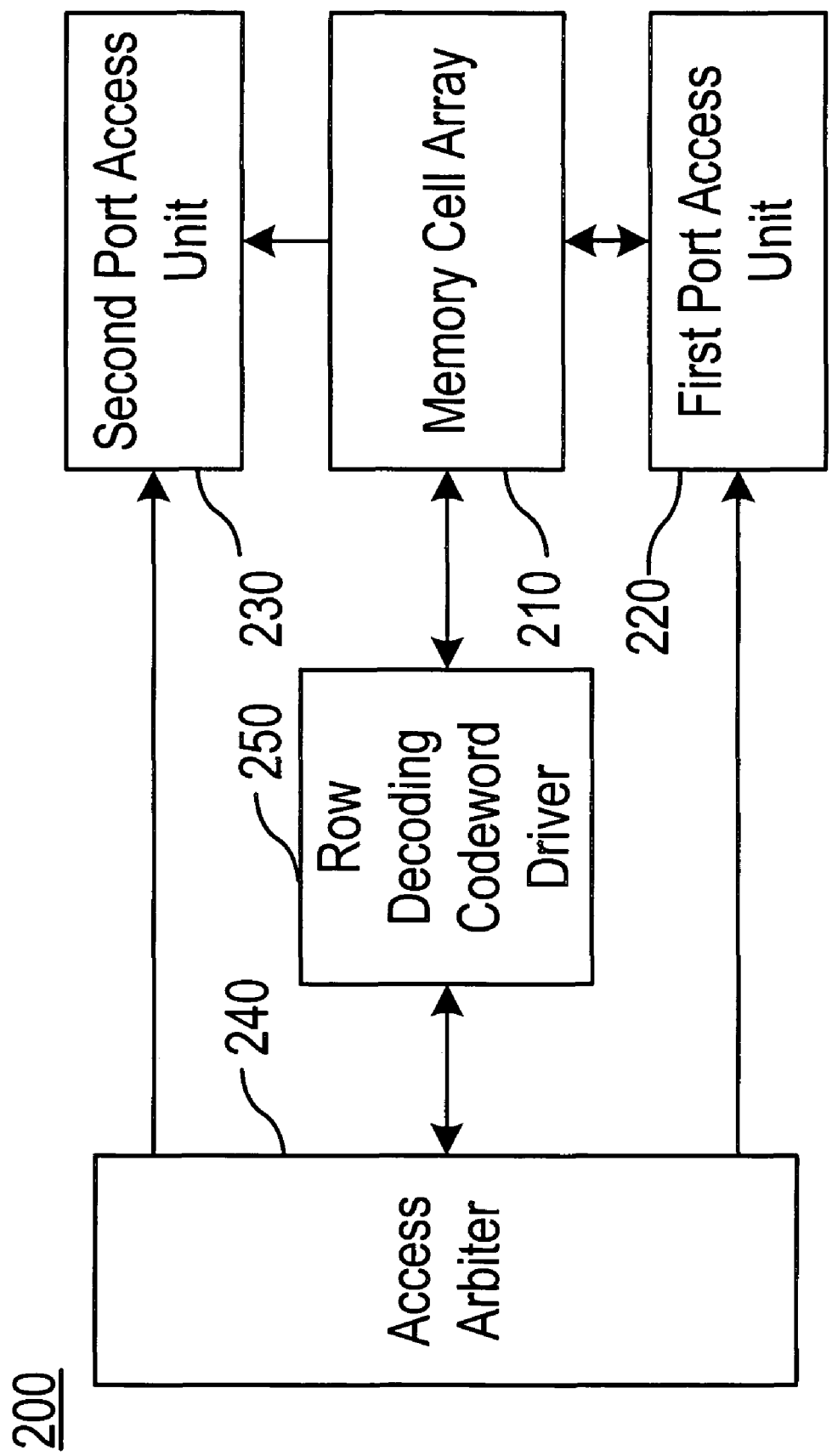
FIG. 2 is a block diagram of an SRAM compatible embedded DRAM system with hidden refresh and dual port capabilities in accordance with an embodiment of the invention.

FIG. 2 is a block diagram of an SRAM compatible embedded DRAM system 200 with hidden refresh and dual port capabilities in accordance with an embodiment of the invention. The compatible embedded DRAM system 200 includes a memory cell array 210, a first port access unit 220, a second port access unit 230, an access arbiter 240 and a row decoding codeword driver 250.

The memory cell array 210 has a plurality of single-port memory cells with dual-port capability, which are preferably implemented with a 1T DRAM.

The first port access unit 220 is connected to the memory cell array 210 in order to access the memory cells of the memory cell array 210. The second port access unit 230 is connected to the memory cell array 210 in order to access the memory cells of the memory cell array 210. The first port access unit is a read and write (read/write, R/W) access port, and the second port access unit is a read-only access port.

The access arbiter 240 is connected to the first port access unit 220 and the second port access unit 230 in order to arbitrate a first port access request, a second port access request and a hidden refresh request.

The row decoding codeword driver 250 is connected to the access arbiter 240 and the memory cell array 210 in order to generate a codeword line address WL[479:0] for further addressing the memory cell array 210.

Figure 3:
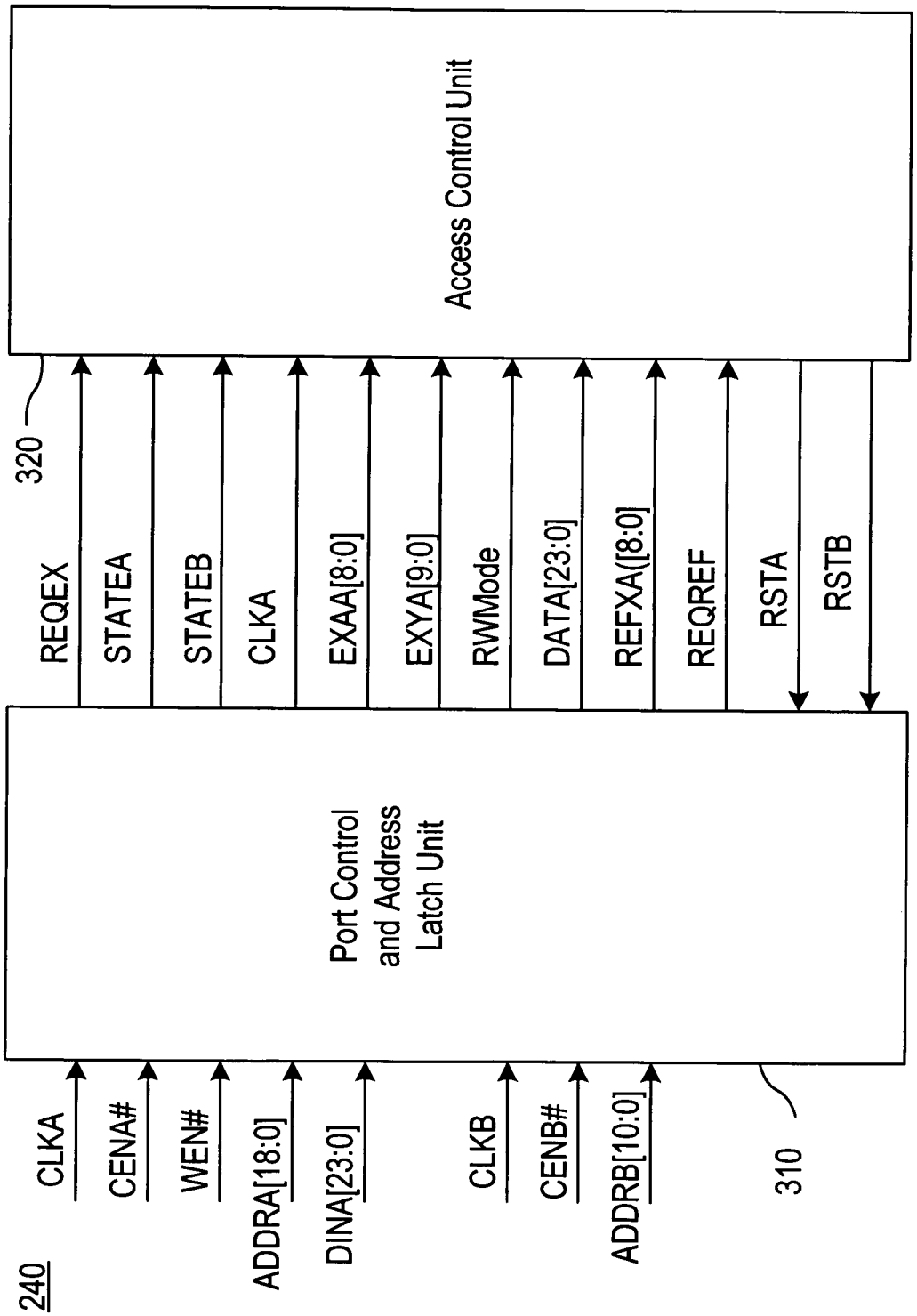
FIG. 3 is a block diagram of an access arbiter in accordance with an embodiment of the invention.

FIG. 3 is a block diagram of the access arbiter 240 in accordance with an embodiment of the invention. The access arbiter 240 has a port control and address latch unit 310 and an access control unit 320.

The port control and address latch unit 310 receives the control signals and addresses, such as CLKA, CENA#, WEN#, ADDRA[18:0], DINA[23:0], for the first port access and the control signals and addresses, such as CLKB, CENB#, ADDRB[10:0], for the second port access to thus generate an access request signal REQEX, a refresh request signal REQREF, a first port state signal STATEA and a second port state signal STATEB. The port control and address latch unit 310 further generates a first internal address signal EXAA[8:0], a second internal address signal EXYA[9:0], a read/write mode signal RWMode, an input data signal DATA[23:0] and a refresh address signal REFXA[8:0].

The access control unit 320 is connected to the port control and address latch unit 310 in order to generate a first port access control signal and a second port access control signal based on the access request signal REQEX, the refresh request signal REQREF, the first port state signal STATEA and the second port state signal STATEB.

Figure 4:
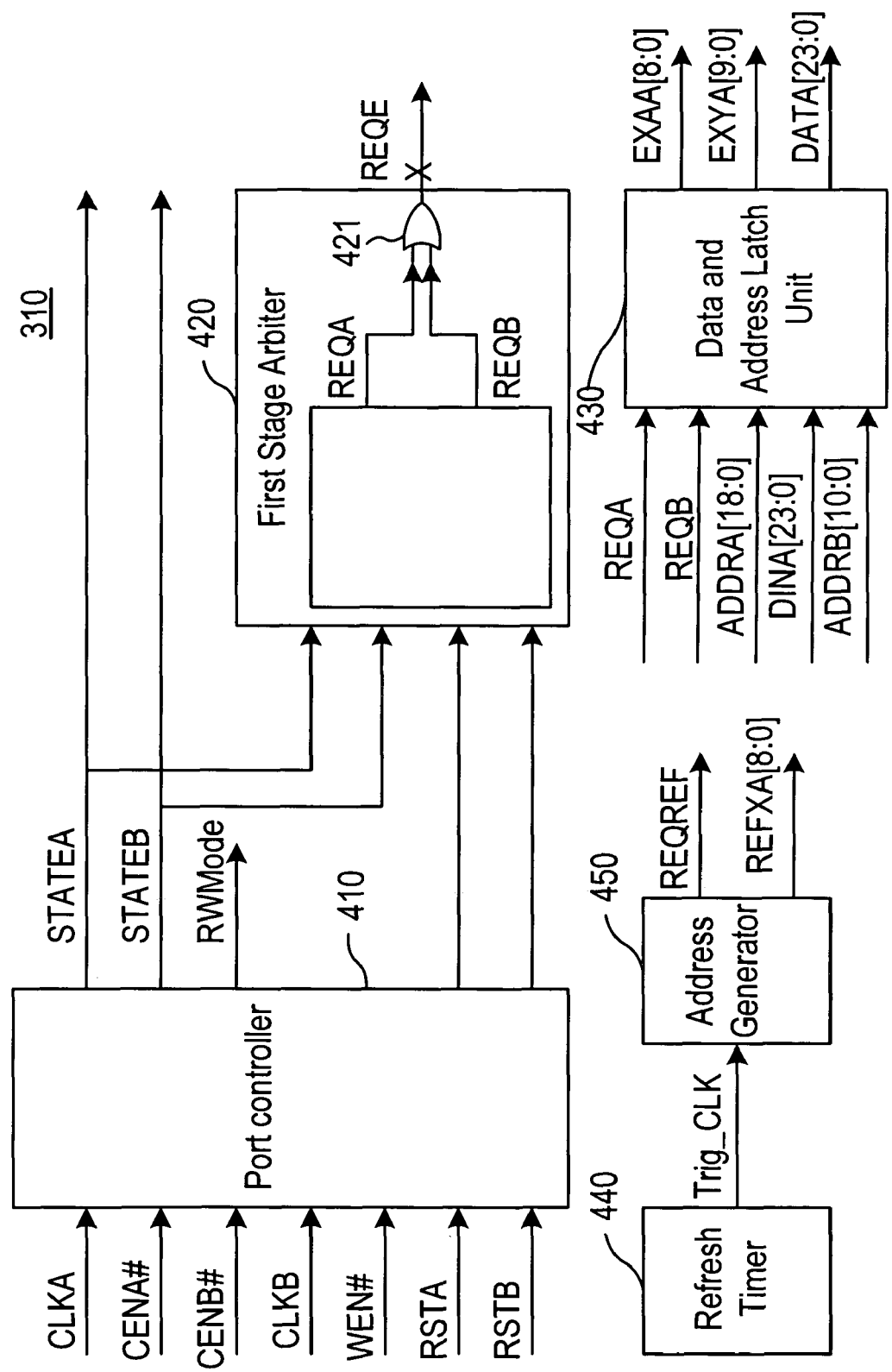
FIG. 4 is a block diagram of a port control and address latch unit in accordance with an embodiment of the invention.

FIG. 4 is a block diagram of the port control and address latch unit 310 in accordance with an embodiment of the invention. The port control and address latch unit 310 has a port controller 410, a first stage arbiter 420, a data and address latch unit 430, a refresh timer 440 and an address generator 450.

The port controller 410 receives a clock signal CLKA and an enable signal CENA# for the first port access unit 220, a clock signal CLKB and an enable signal CENB# for the second port access unit 230, and a write signal WEN# in order to generate the first port state signal STATEA, the second port state signal STATEB and the read/write mode signal RWMode. The port controller 410 can trace the incomplete accesses based on the first port state signal STATEA and the second port state signal STATEB.

The first stage arbiter 420 is connected to the port controller 410 in order to receive the first port state signal STATEA and the second port state signal STATEB to thereby generate a first port request signal and a second port request signal and accordingly generate the access request signal. The first stage arbiter 420 uses a First Come First Service (FCFS) arbitration mechanism to generate the first port request signal and the second port request signal. When the first port request signal is at high, it means that a control signal for the first port access unit 220 can be generated. When the second port request signal is at high, it means that a control signal for the second port access unit 220 can be generated. In addition, only one of the first port request signal or the second port request signal is at high at the same time.

The first port and the second port request signals pass through an OR gate 421 to thereby generate the access request signal.

The data and address latch unit 430 is connected to the first stage arbiter 420 in order to latch the first port address signal ADDRA[18:0], the second port address signal ADDRB[10:0] and the first port write data signal DINA[23:0] based on the first port request signal and the second port request signal to further generate the first internal address signal EXAA[8:0], the second internal address signal EXYA[9:0] and the input data signal DATA[23:0].

The refresh timer 440 is based on a predetermined time interval to generate a trigger clock signal Trig_CLK.

The address generator 450 is connected to the refresh timer 440 in order to generate the refresh request signal REQREF and the refresh address signal REFXA[8:0] based on the trigger clock signal Trig_CLK. The refresh request signal REQREF is sent to the access controller 320 for refreshing a row of memory cells in the memory cell array 210.

The refresh timer 440 traces the charge retaining time of the memory cells in the memory cell array 210 and periodically generates the trigger clock signal for driving the address generator 450 to refresh a row of memory cells in the memory cell array 210. The address generator 450 receives the trigger clock signal and adds the refresh address signal REFXA[8:0] by one to update the refresh address signal REFXA[8:0], and generates the refresh request signal REQREF. Thus, in the invention, there is no need to have external signal and refreshed row address for a refresh operation.

Figure 5:
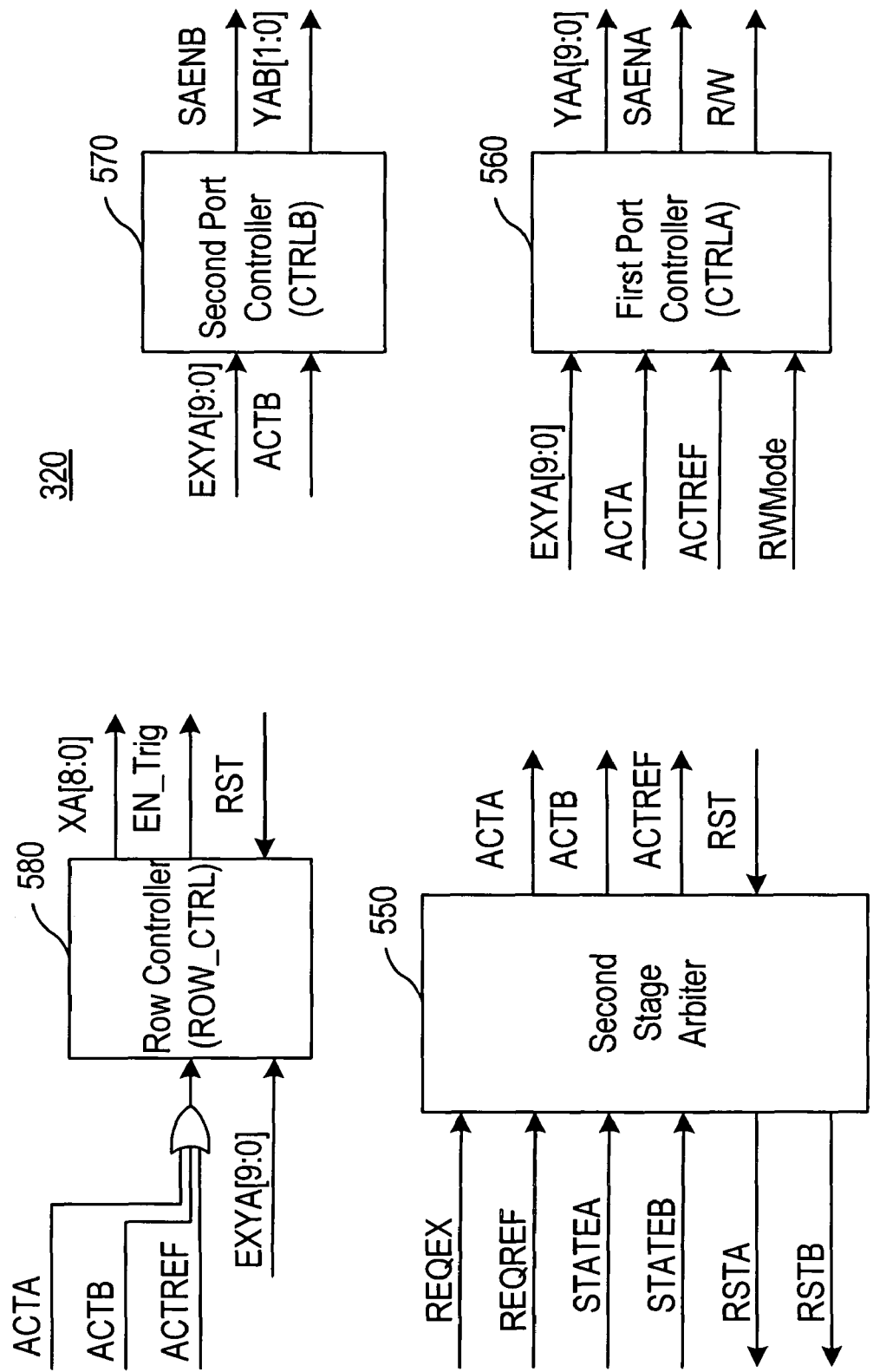
FIG. 5 is a block diagram of an access control unit in accordance with an embodiment of the invention.

FIG. 5 is a block diagram of the access control unit 320 in accordance with an embodiment of the invention. The access control unit 320 has a second stage arbiter 550, a first port controller (CTRLA) 560, a second port controller (CTRLB) 570 and a row controller 580.

The second stage arbiter 550 is connected to the port controller 410 and the first stage arbiter 420 in order to receive the access request signal REQEX, the refresh request signal REQREF, the first port state signal STATEA and the second port state signal STATEB, and use the FCFS arbitration mechanism to generate a first port enable signal ACTA, a second port enable signal ACTB and a refresh enable signal ACTREF.

The first port controller (CTRLA) 560 is connected to the port controller 410, the data and address latch unit 430 and the second stage arbiter 550 in order to generate a read/write signal R/W, a first sense amplifier enable signal SAENA and a first column address signal YAA[9:0] based on the read/write mode signal RWMode, the first port enable signal ACTA, the refresh enable signal ACTREF and the second internal address signal EXYA[9:0].

The second port controller (CTRLB) 570 is connected to the data and address latch unit 430 and the second stage arbiter 550 in order to generate a second sense amplifier enable signal SAENB and a second column address signal YAB[1:0] based on the second port enable signal ACTB and the second internal address signal EXYA[9:0].

The row controller 580 is connected to the second stage arbiter 550 and the data and address latch unit 430 in order to generate a row address signal XA[8:0] and a row enable signal EN_Trig based on the first port enable signal, the second port enable signal, the refresh enable signal ACTREF and the first internal address signal EXAA[8:0].

When the access arbiter 240 receives memory access requests from the first port request signal, the second port request signal and the refresh request signal, the second stage arbiter 550 judges the external memory access request REQEX or the refresh request REQREF to have higher priority. Since the first stage arbiter 420 determines that the first port access request or the second port access request has higher priority, only one of the first port request signal REQA and the second port request signal REQB is enabled. Accordingly, the second stage arbiter 550 is a two-way arbiter which only considers the access request signal REQEX and the refresh request signal REQREF. In this case, only one of the first port enable signal ACTA, the second port enable signal ACTB and the refresh enable signal ACTREF is triggered.

When the first port of the memory cell array 210 is to be accessed, the first port enable signal ACTA makes the first port controller (CTRLA) 560 send the accurate first column address signal YAA[9:0] and the first sense amplifier enable signal SAENA to the first port access unit 220 and send the read/write signal R/W to indicate the current first port operation as a read or write data operation.

When the second port of the memory cell array 210 is to be accessed, the second port enable signal ACTB makes the second port controller (CTRLB) 570 send the accurate second column address signal YAB[1:0] and the second sense amplifier enable signal SAENB to the second port access unit 230.

When the memory refresh is to be performed, a read and write back operation is performed through the first port. Accordingly, when the readout operation is performed, the read/write signal R/W and the first sense amplifier enable signal SAENA are enabled. In this case, there is no data output to the outside, and the first column address signal YAA[9:0] is not sent.

Whether the first port access, the second port access or the memory refresh is operated, the row controller (ROW_CTRL) 580 outputs the row address signal XA[8:0] and the row enable signal EN_Trig to the row decoding codeword driver 250. In addition, a reset signal RST from the memory cell array 210 is fed back to the row controller (ROW_CTRL) 580 and the second stage arbiter 550. The second stage arbiter 550 is based on the reset signal RST to generate a first reset signal RSTA and a second reset signal RSTB to the access control unit 320.

Figure 6:
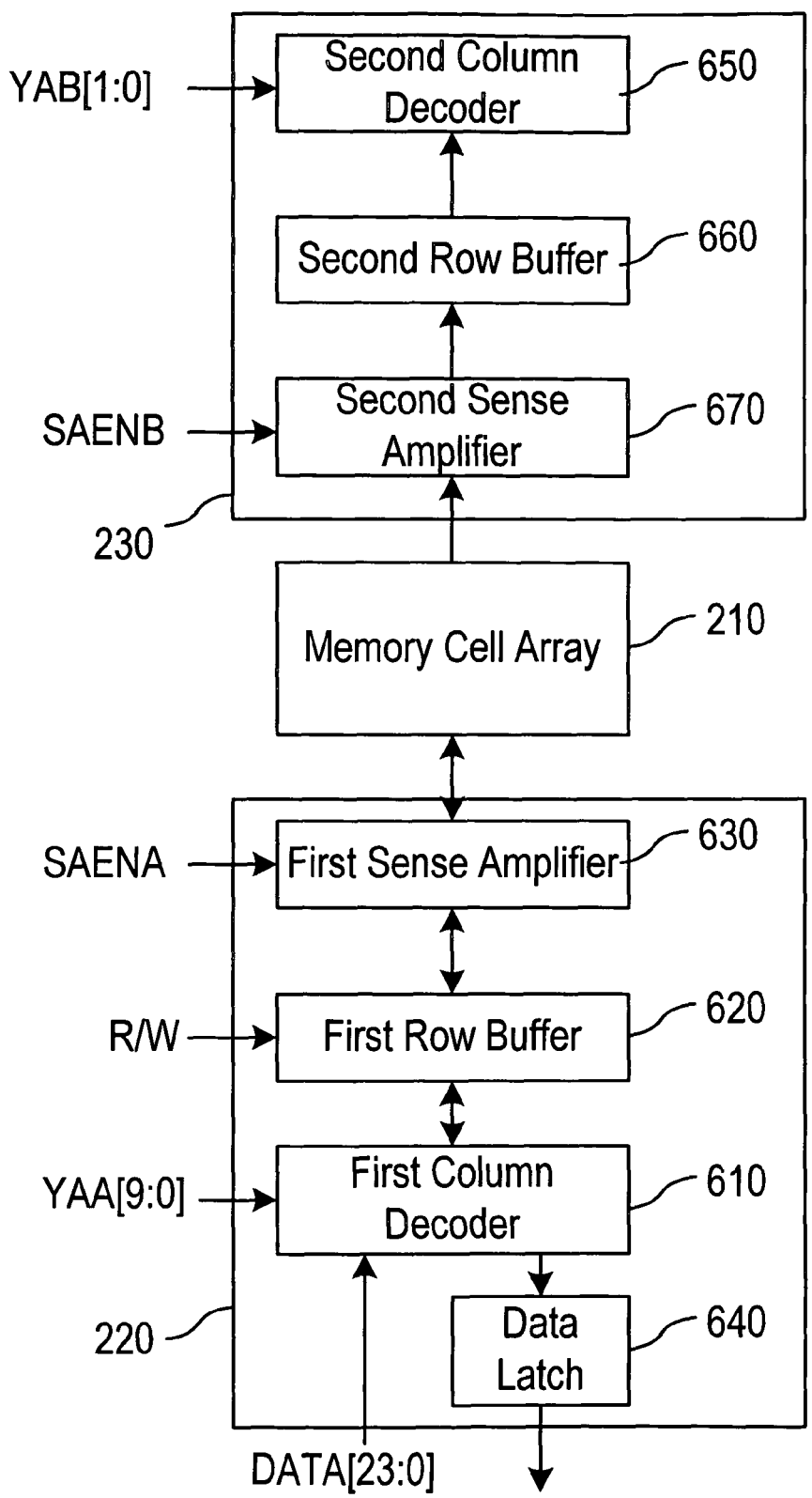
FIG. 6 is a block diagram of first port and second port access units in accordance with an embodiment of the invention.

FIG. 6 is a block diagram of the first port access unit 220 and the second port access unit 230 in accordance with an embodiment of the invention. The first port access unit 220 has a first column decoder 610, a first row buffer 620, a first sense amplifier 630 and a data latch 640.

The first column decoder 610 is connected to the data and address latch unit 430 and the first port controller (CTRLA) 560 in order to perform a decoding operation based on the first column address signal YAA[9:0] and receive the input data signal DATA[23:0].

The first row buffer 620 is connected to the first column decoder 610 and the first port controller (CTRLA) 560 in order to determine a data flow direction based on the read/write signal R/W. The first row buffer 620 receives data read from the memory cell array 210 and sends the data to the first column decoder 610, or receives data sent by the first column decoder 610 and writes the data in the memory cell array 210 through the first sense amplifier 630.

The first sense amplifier 630 is connected to the first row buffer 620, the first port controller (CTRLA) 560 and the memory cell array 210 in order to receive the first sense amplifier enable signal SAENA to thereby amplify the data read from the memory cell array 210 and send the amplified data to the first row buffer 620.

The data latch 640 is connected to the first column decoder 610 in order to receive data outputted by the first column decoder 610 and output the data to the outside.

The first column decoder 610 selects a bit of pixel from the first row buffer 620 to read or write.

As shown in FIG. 6, the second port access unit 230 has a second column decoder 650, a second row buffer 660 and a second sense amplifier 670.

The second column decoder 650 is connected to the second port controller (CTRLB) 570 in order to perform a decoding operation based on the second column address signal YAB[1:0]. The second column decoder 650 selects a part of bits from the second row buffer 660 to read or write.

The second row buffer 660 is connected to the second column decoder 650 in order to output data to the second column decoder 650.

The second sense amplifier 670 is connected to the second row buffer 660, the second port controller (CTRLB) 570 and the memory cell array 210 in order to receive the second sense amplifier enable signal SAENB to thereby amplify the data read from the memory cell array 210 and send the amplified data to the second row buffer 660.

The access arbiter 240 determines which port is used to access the memory cell array 210. In this case, only one of the first sense amplifier 630 and the second sense amplifier 670 is enabled at the same time. The first sense amplifier 630, the second sense amplifier 670, the first row buffer 620 and the second row buffer 660 access data in a unit of row. The first column decoder 610 selects a bit of pixel from the first tow buffer 620 to read or write. In addition, the second column decoder 650 selects a part of bits from the second row buffer 660 to read or write.

The row decoding codeword driver 250 generates the codeword line address WL[479:0] after decoding and pulls a codeword line to high (enabled) when the row enable signal EN_Trig is received. When a read, write or refresh operation is complete, the memory cell array 210 generates the reset signal RST to turn the codeword line off (disabled).

Figure 7:
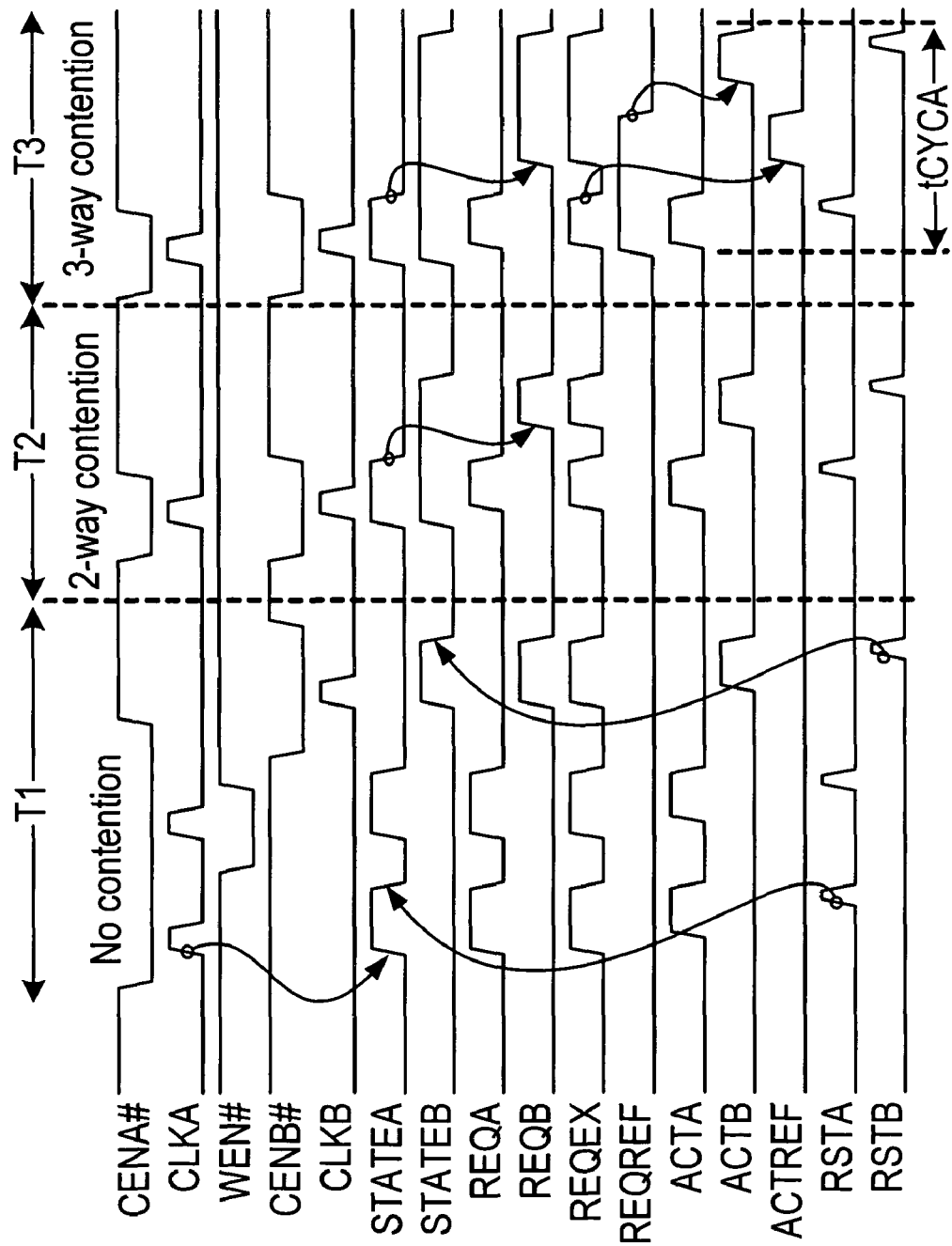
FIG. 7 is a timing of memory data accesses with contention and no contention in accordance with an embodiment of the invention.

FIG. 7 is a timing of memory data accesses with contention and no contention in accordance with an embodiment of the invention. As shown in FIG. 7, in the time interval T1, there is no contention in memory access, which first generates a read command to the first port of the memory cell array 210, then generates a write command, and finally generates a read command to the second port. When the first port state signal STATEA and the second port state signal STATEB are at high, it indicates that the first port and the second port are accessed. As shown in FIG. 7, the first port and second port state signals STATEA and STATEB are not enabled (at a high potential) at the same time. When the first reset signal RSTA is at high, it resets the first port state signal STATEA to a low potential.

In the time interval T2, there is a contention in memory access. The contention is solved by the first stage arbiter 420.

As shown in FIG. 7, when the first port state signal STATEA and the second port state signal STATEB are driven to high, it indicates that the first port and the second port are accessed at the same time. In this case, the first stage arbiter 420 determines that the first port access has the priority and accordingly outputs the first port request signal REQA at high. When the first port access is complete, the first reset signal RSTA becomes high to reset the first port state signal STATEA to a low potential. Next, the second port request signal REQB at high is outputted to thereby perform the second port access. When the second port access is complete, the second reset signal RSTB becomes high to reset the second port state signal STATEB to the low potential.

In the time interval T3, there is a contention and refresh in memory access. In this case, the first port access has the highest priority. When the first port access is complete, the refresh request signal REQREF obtains the right of access to the memory cell array 210. The second stage arbiter 550 essentially sees the refresh request signal REQREF and does not see the access request signal REQEX during a short period of time after the first port access is complete, and accordingly assigns the access right to the refresh request signal REQREF to thereby cause the refresh request signal REQREF to remain waiting.

A 3-way arbitration is implemented by connecting the first stage arbiter 420 and the second stage arbiter 550 in series. The first stage arbiter 420 and the second stage arbiter 550 are of a 2-way arbitration and apply the FCFS arbitration mechanism. By way of such a 3-way arbitration, the refresh request signal REQREF is not of the lowest priority, even the refresh request signal REQREF is slightly later than the first port state signal STATEA and the second port state signal STATEB.

Figure 8:
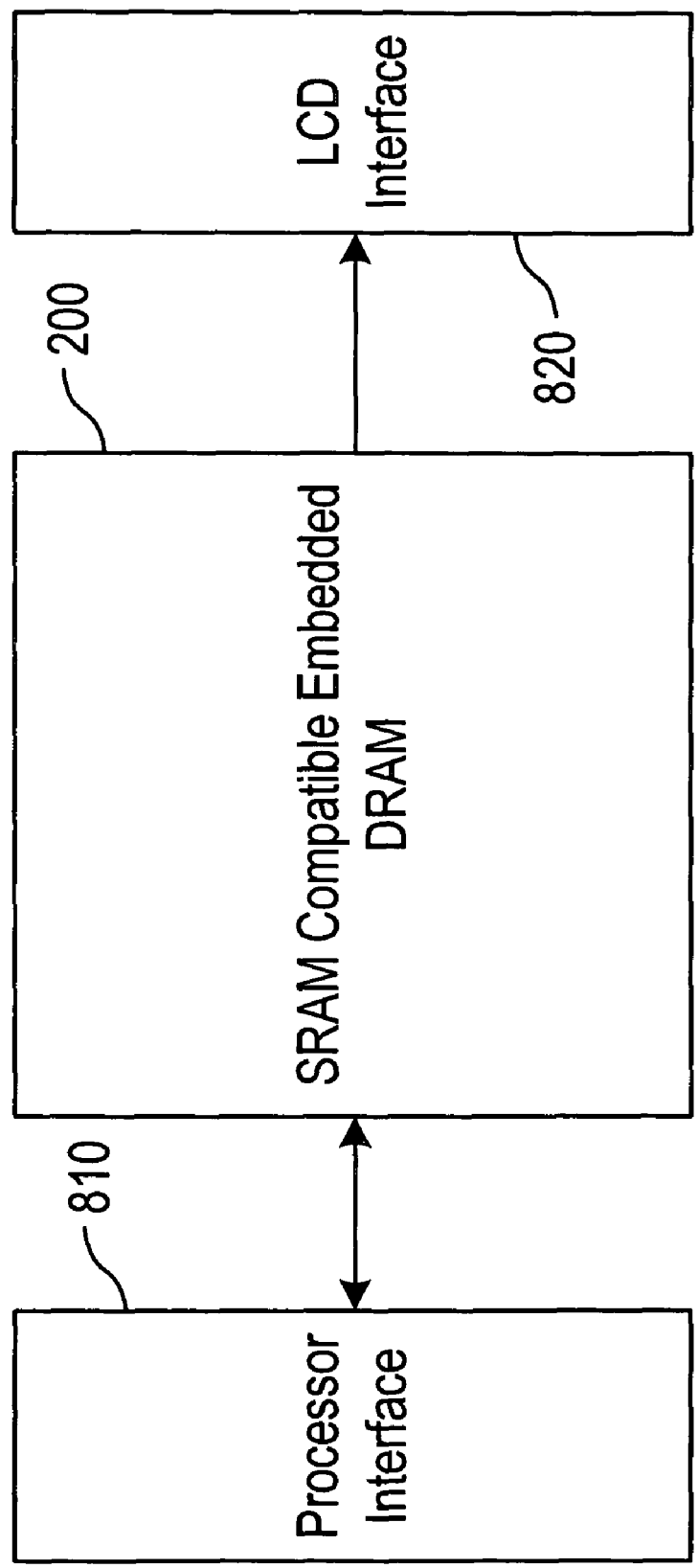
FIG. 8 is a schematic diagram of an LCD system using an SRAM compatible embedded DRAM device with hidden refresh and dual port capabilities in accordance with an embodiment of the invention.

FIG. 8 is a schematic diagram of an LCD system using an SRAM compatible embedded DRAM device with hidden refresh and dual port capabilities in accordance with an embodiment of the invention. The LCD system includes a processor interface 810, the SRAM compatible embedded DRAM device 200 with hidden refresh and dual port capabilities, and an LCD interface 820.

The processor interface 810 receives a read/write signal from a processor. The SRAM compatible embedded DRAM device 200 is connected to the processor interface 810 and includes a memory cell array 210, a first port access unit 220, a second port access unit 230, an access arbiter 240 and a row decoding codeword driver 250. The LCD interface 820 is connected to the embedded DRAM device 200 in order to present data of the embedded DRAM device 200. The processor interface 810 is connected to a first port of the embedded DRAM device 200, and the LCD interface 820 is connected to a second port of the embedded DRAM device 200. Namely, the processor interface 810 can perform a read/write operation, and the LCD interface 820 can perform only a read operation.

In applying the LCD system, the processor interface 810 has an access frequency quicker than that of the LCD interface 820 and a refresh request frequency of the memory cell array 210. Accordingly, the shortest access cycle tCYCA of the processor interface 810 is not shorter than a total of the access cycles tA, tB, tREF respectively of the first port, the second port and the refresh request.

Figure 9:
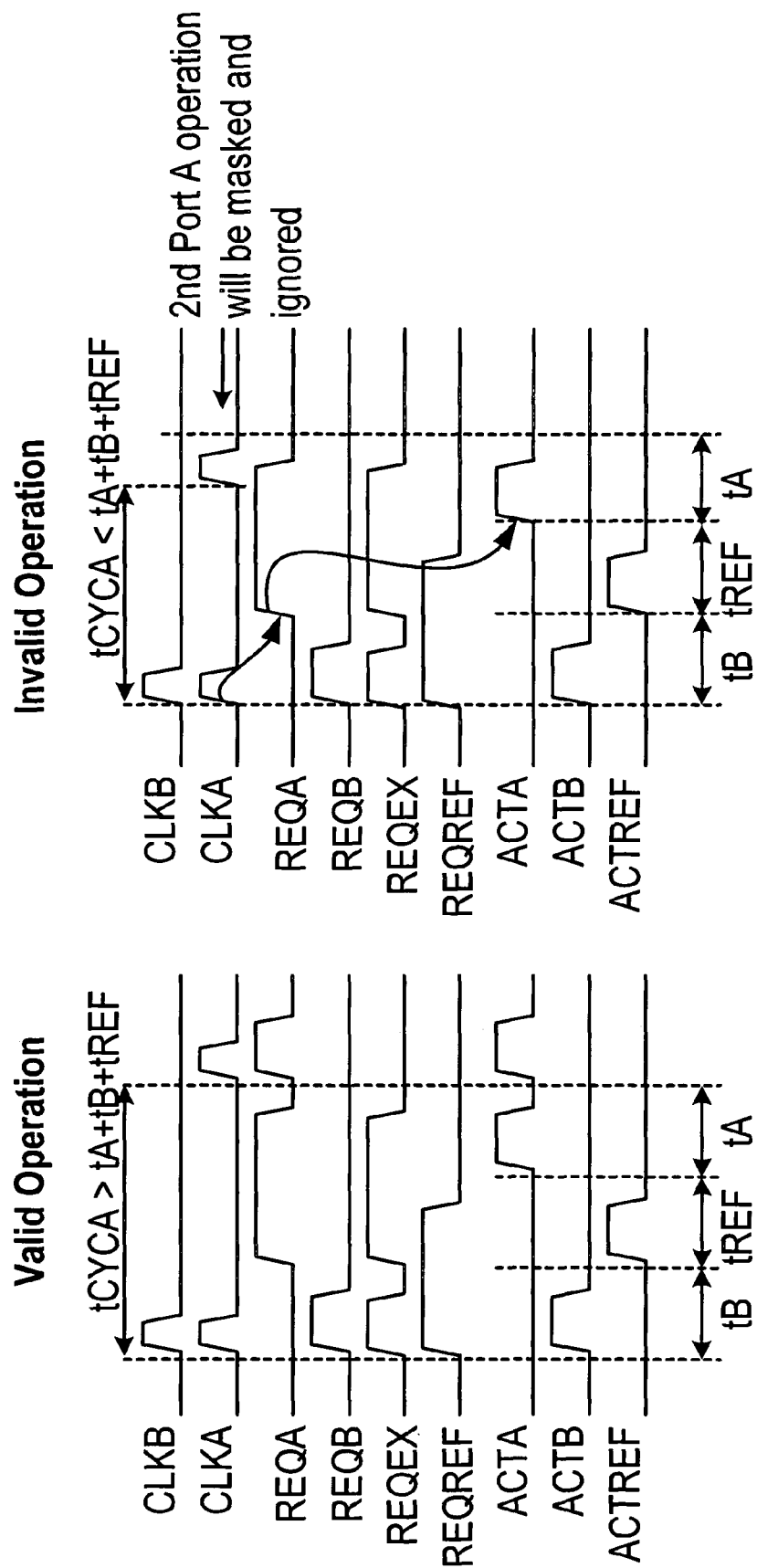
FIG. 9 is a timing of valid and invalid operations of FIG. 8 in accordance with an embodiment of the invention.

FIG. 9 is a timing of valid and invalid operations of FIG. 8 in accordance with an embodiment of the invention. As shown in the timing of FIG. 9 at the left hand, when the shortest access cycle tCYCA of the processor interface 810 is longer than the total of the access cycles tA, tB, tREF, the processor interface is usually operated. As shown in the timing of FIG. 9 at the right hand, when the shortest access cycle tCYCA of the processor interface 810 is shorter than the total of the access cycles tA, tB, tREF, the second time access operation of the processor interface 810 is omitted, and the operating frequency of the processor interface 810 is limited.

FIG. 10 is a schematic diagram of a two-stage arbitration applied in FIG. 8 in accordance with an embodiment of the invention. As shown in FIG. 10, the first port and the second port access requests STATEA, STATEB are arbitrated, and subsequently the resulting output STATEA or STATEB and the refresh request signal REQREF are arbitrated. As such, the configuration implies that the refresh request signal REQREF will not have the lowest priority.

Figure 12:
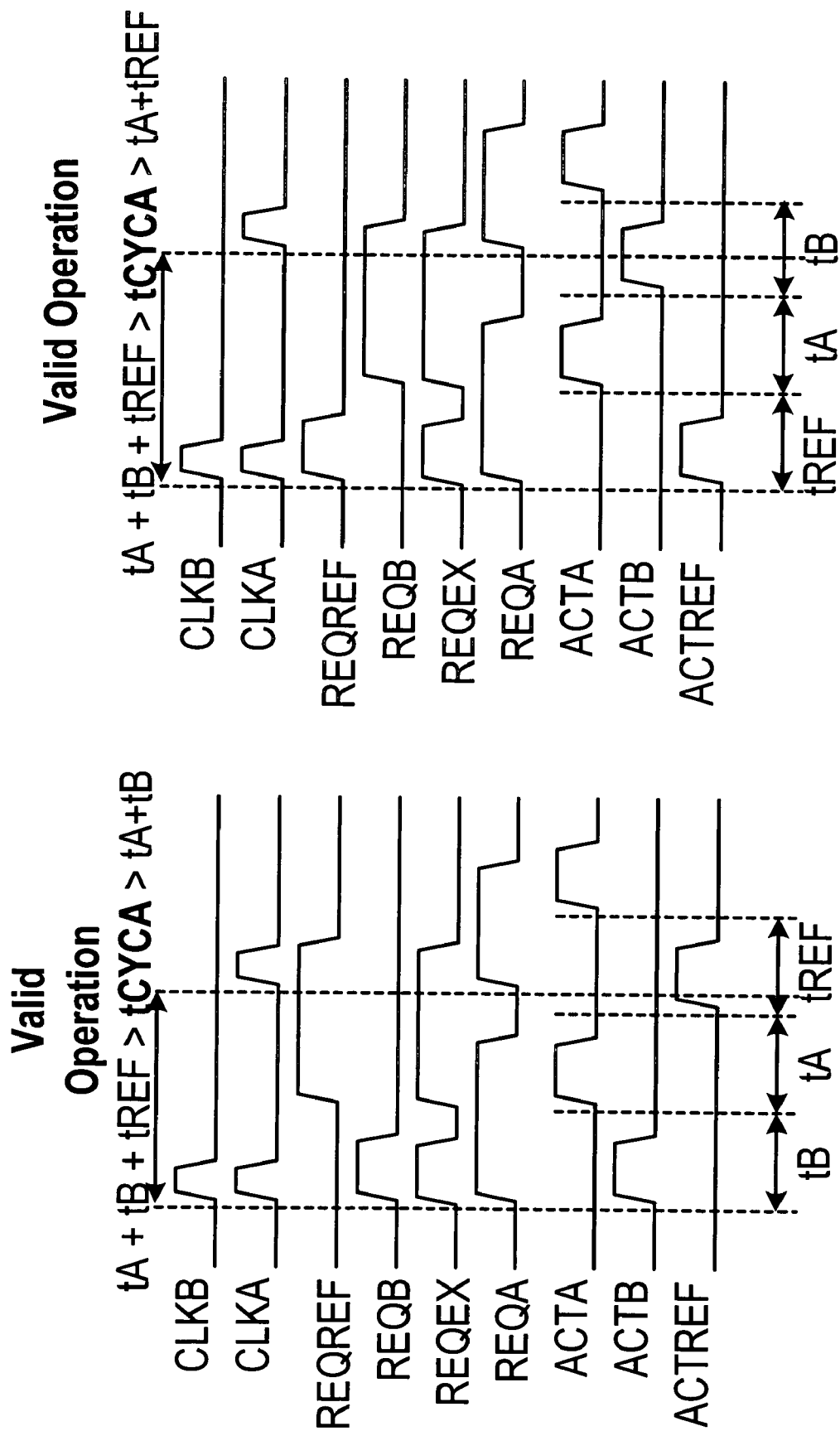
FIG. 12 is another timing of valid and invalid operations of FIG. 8 in accordance with an embodiment of the invention.

FIG. 11 is a schematic diagram of another two-stage arbitration applied in FIG. 8 in accordance with an embodiment of the invention. As shown in FIG. 11, the second port access request STATEB and the refresh request signal REQREF are arbitrated, and subsequently the resulting output STATEB or REQRES and the first port access request STATEA are arbitrated. FIG. 12 is another timing of valid and invalid operations of FIG. 8 in accordance with an embodiment of the invention. As shown in FIG. 12, when the shortest access cycle tCYCA of the processor interface 810 is not shorter than a total of the access cycles tA, tB respectively of the first port and the second port, or than a total of the access cycles tA, tREF respectively of the first port and the refresh request, the processor interface 810 can be operated as usual. Thus, the operating frequency of the processor interface 810 is increased.

As cited, the embedded DRAM device in the prior art only considers a single port access, while ignoring the operations inside a system on chip (SoC). The invention uses a first stage arbiter 420 and a second stage arbiter 550 to form a 3-way arbitration to thereby effectively increase the access performance of the memory cell array 210, and uses time division multiplexing scheme to emulate the single-port memory cell array 210 as dual-port memory, and access the first port and read the second port of the memory cell array 210 concurrently. Thus the clock for the SoC can be increased.

Although the present invention has been explained in relation to its preferred embodiment, it is to be understood that many other possible modifications and variations can be made without departing from the spirit and scope of the invention as hereinafter claimed.

What is claimed is:

1. An SRAM compatible embedded DRAM device with hidden refresh and dual port capabilities, comprising:
 a memory cell array, having a plurality of single-port memory cells with dual-port capability;
 a first port access unit, connected to the memory cell array, for accessing the memory cells;
 a second port access unit, connected to the memory cell array, for accessing the memory cells;
 an access arbiter, connected to the first and the second port access units, for arbitrating a first port access request, a second port access request and a hidden refresh request; and
 a row decoding codeword driver, connected to the access arbiter and the memory cell array for generating a codeword line address in order to address the memory cell array,
 wherein the access arbiter comprises: a port control and address latch unit, for receiving control signals and addresses respectively from the first port access unit and the second port access unit to thus generate an access request signal, a refresh request signal, a first port state signal and a second port state signal; and an access control unit, connected to the port control and address latch unit, for generating a first port access control signal and a second port access control signal based on the access request signal, the refresh request signal, the first port state signal and the second port state signal, the port control and address latch unit comprising: a port controller, for receiving clock signals and enable signals respectively from the first port access unit and the second port access unit and a write signal from the second port access unit so as to generate the first port state signal, the second port state signal and a read/write mode signal; a first stage arbiter, connected to the port controller for receiving the first port state signal and the second port state signal to generate a first port request signal and a second port request signal and accordingly generate the access request signal; and a data and address latch unit, connected to the first stage arbiter for latching a first port address signal, a second port address signal and a first port write data signal based on the first port request signal and the second port request signal to further generate a first internal address signal, a second internal address signal and an input data signal.

2. The device as claimed in claim 1, wherein the port control and address latch unit further comprises:
a refresh timer, for generating a trigger clock signal based on a predetermined time interval; and
an address generator, connected to the refresh timer, for generating the refresh request signal and a refresh address signal based on the trigger clock signal.

3. The device as claimed in claim 2, wherein the access control unit comprises:
a second stage arbiter, connected to the port controller and the first stage arbiter, for receiving the access request signal, the refresh request signal, the first port state signal and the second port state signal to thereby generate a first port enable signal, a second port enable signal and a refresh enable signal;
a first port controller, connected to the port controller, the data and address latch unit and the second stage arbiter, for generating a read/write signal, a first sense amplifier enable signal and a first column address signal based on the read/write mode signal, the first port enable signal, the refresh enable signal and the second internal address signal; and
a second port controller, connected to the data and address latch unit and the second stage arbiter, for generating a second sense amplifier enable signal and a second column address signal based on the second port enable signal and the second internal address signal.

4. The device as claimed in claim 3, wherein the access control unit further comprises:
a row controller, connected to the second stage arbiter and the data and address latch unit, for generating a row location signal and a row enable signal based on the first port enable signal, the second port enable signal, the refresh enable signal and the first internal address signal.

5. The device as claimed in claim 4, wherein the first port access unit comprises:
a first column decoder, connected to the data and address latch unit and the first port controller, for performing a decoding operation based on the first column address signal and receive the input data signal;
a first row buffer, connected to the first column decoder and the first port controller, for determining a data flow direction based on the read/write signal, where the first row buffer receives data read from the memory cell array and sends the data to the first column decoder, or receives data sent by the first column decoder and writes the data in the memory cell array; and
a first sense amplifier, connected to the first row buffer, the first port controller and the memory cell array, for receiving the first sense amplifier enable signal to thereby amplify the data read from the memory cell array and send the amplified data to the first row buffer.

6. The device as claimed in claim 5, wherein the first column decoder selects a bit of pixel from the first row buffer to read or write.

7. The device as claimed in claim 4, wherein the second port access unit comprises:
a second column decoder, connected to the second port controller for performing a decoding operation based on the second column address signal;
a second row buffer, connected to the second column decoder for outputting data to the second column decoder; and
a second sense amplifier, connected to the second row buffer, the second port controller and the memory cell array for receiving the second sense amplifier enable signal to thereby amplify data read from the memory cell array and send the amplified data to the second row buffer.

8. The device as claimed in claim 7, wherein the second column decoder selects a part of bits from the second row buffer to read or write.

9. The device as claimed in claim 3, wherein the second stage arbiter comprises the FCFS arbitration mechanism to thereby generate the first port enable signal, the second port enable signal and the refresh enable signal.

10. The device as claimed in claim 1, wherein the first port access unit is a read and write (R/W) access port, and the second port access unit is a write-only access port.

11. The device as claimed in claim 1, wherein the first stage arbiter comprises a First Come First Service (FCFS) arbitration mechanism to thereby generate the first port request signal and the second port request signal.

12. The device as claimed in claim 1, which is applied in an LCD system, wherein the LCD system comprises:
a processor interface, which receives a read/write signal of a processor and is connected to the embedded DRAM device; and
an LCD interface, connected to the embedded DRAM device for presenting data of the embedded DRAM device.

13. The device as claimed in claim 12, wherein the access arbiter is a two stage access arbiter, which performs an access arbitration to an access request and hidden refresh request of the first port access unit at first stage to thereby generate an output, and performs another access arbitration to the output and an access request of the second port access unit at second stage.

14. The device as claimed in claim 13, wherein the processor interface accesses the memory cell array through the first port access unit, and the LCD interface accesses the memory cell array through the second port access unit.

15. An SRAM compatible embedded DRAM device with hidden refresh and dual port capabilities, comprising:
a memory cell array, having a plurality of single-port memory cells with dual-port capability;
a first port access unit, connected to the memory cell array, for accessing the memory cells;
a second port access unit, connected to the memory cell array, for accessing the memory cells;
an access arbiter, connected to the first and the second port access units, for arbitrating a first port access request, a second port access request and a hidden refresh request, wherein the access arbiter is a two stage access arbiter, which performs an access arbitration to an access request and hidden refresh request of the first port access unit at first stage to thereby generate an output, and performs another access arbitration to the output and an access request of the second port access unit at second stage; and a row decoding codeword driver, connected to the access arbiter and the memory cell array for generating a codeword line address in order to address the memory cell array, wherein the SRAM compatible embedded DRAM device is applied in an LCD system comprising: a processor interface, which receives a read/write signal of a processor and is connected to the embedded DRAM device; and an LCD interface, connected to the embedded DRAM device for presenting data of the embedded DRAM device.

16. The device as claimed in claim 15, wherein the processor interface accesses the memory cell array through the first port access unit, and the LCD interface accesses the memory cell array through the second port access unit.

* * * * *